US009082846B2

(12) United States Patent
Lu et al.

(10) Patent No.: US 9,082,846 B2
(45) Date of Patent: Jul. 14, 2015

(54) INTEGRATED CIRCUITS WITH LATERALLY DIFFUSED METAL OXIDE SEMICONDUCTOR STRUCTURES

(71) Applicant: GLOBALFOUNDRIES Singapore Pte. Ltd., Singapore (SG)

(72) Inventors: Yi Lu, Singapore (SG); Dongli Wang, Singapore (SG); Deyan Chen, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 135 days.

(21) Appl. No.: 13/870,771

(22) Filed: Apr. 25, 2013

(65) Prior Publication Data

US 2014/0320174 A1 Oct. 30, 2014

(51) Int. Cl.
| | |
|---|---|
| *H01L 29/49* | (2006.01) |
| *H01L 27/06* | (2006.01) |
| *H01L 29/78* | (2006.01) |
| *H03K 3/01* | (2006.01) |
| *H01L 27/088* | (2006.01) |

(52) U.S. Cl.
CPC .......... *H01L 29/7816* (2013.01); *H01L 27/088* (2013.01); *H03K 3/01* (2013.01)

(58) Field of Classification Search
CPC ..... H01L 29/7816; H01L 27/088; H01K 3/01
USPC .......... 257/300, 335, 337, 343, 409, E29.152, 257/E29.256, E29.268, E21.417; 327/109; 438/197, 286, 294
See application file for complete search history.

(56) References Cited

U.S. PATENT DOCUMENTS

| 7,816,744 | B2 * | 10/2010 | Su et al. ........................ 257/409 |
| 7,820,517 | B2 | 10/2010 | Gammel et al. |
| 2006/0001050 | A1 * | 1/2006 | Wang et al. ................... 257/213 |
| 2010/0102388 | A1 | 4/2010 | Levin et al. |
| 2010/0314675 | A1 * | 12/2010 | Ko et al. ........................ 257/300 |
| 2012/0126323 | A1 * | 5/2012 | Wu et al. ....................... 257/343 |
| 2013/0181286 | A1 * | 7/2013 | Zhang ........................... 257/335 |
| 2014/0239391 | A1 * | 8/2014 | Toh et al. ....................... 257/339 |

\* cited by examiner

*Primary Examiner* — Dao H Nguyen
(74) *Attorney, Agent, or Firm* — Ingrassia Fisher & Lorenz, P.C.

(57) ABSTRACT

Integrated circuits with improved LDMOS structures are provided. An integrated circuit includes a semiconductor substrate, a plurality of shallow trench isolation (STI) regions, each extending at least a first depth below an upper surface of the semiconductor substrate. The STI regions electrically isolate devices fabricated in the semiconductor substrate. The integrated circuit further includes a transistor structure. The transistor structure includes a gate dielectric positioned over a portion of a first one of the plurality of STI regions, a drain region adjacent to the first one of the plurality of STI regions and spaced apart from the gate dielectric, a first gate electrode that extends over a first portion of the gate dielectric, a second gate electrode that extends over a second portion of the gate dielectric and positioned adjacent to the first gate electrode, and a source region positioned adjacent to the first portion of the gate dielectric.

17 Claims, 12 Drawing Sheets

INTEGRATED CIRCUITS WITH LATERALLY DIFFUSED METAL OXIDE SEMICONDUCTOR STRUCTURES

TECHNICAL FIELD

The technical field generally relates to integrated circuits, and more particularly relates to laterally diffused metal oxide semiconductor integrated circuits.

BACKGROUND

Power MOS devices, including lateral diffused MOS (LDMOS) devices, are employed in a wide variety of applications, such as, for example, power amplifiers in wireless communications systems. "Hot carrier injection" (HCI) degradation can significantly limit the performance of these devices, particularly when operating in a saturation region. As is well known, the HCI phenomenon generally results from heating and subsequent injection of charge carriers into the gate oxide and/or an oxide layer above a drift region of an LDMOS device. This injection of charge carriers often results in a localized and non-uniform buildup of interface states and oxide charges near and underneath a gate and/or in the drift region of the device. For example, HCI can produce variations in certain characteristics of the LDMOS device, including saturation current, threshold voltage, transconductance, on-resistance, etc., thus undesirably affecting the performance and reliability of the device.

A conventional LDMOS device typically includes a lightly-doped drain (LDD) region which is often formed at or near an upper surface interface between the silicon and oxide of the device. Locating the LDD region in close relative proximity to the silicon/oxide interface, however, significantly increases the likelihood that charged carriers will become trapped at the interface, thereby increasing HCI degradation in the device. The amount of HCI degradation in the device can be measured as a function of the amount of increase in the on-resistance of the device (on-resistance degradation) and/or the amount of decrease in the saturation current (saturation current degradation) in the device.

In many applications, such as, for example, power applications, it is desirable to minimize the on-resistance associated with the device. In an LDMOS device, since the on-resistance is dominated primarily by the characteristics of the LDD region, one known methodology for reducing the on-resistance is to increase a doping concentration of the LDD region. However, since the LDD region is typically formed at the silicon/oxide interface of the device, as previously stated, increasing the doping concentration of the LDD region also undesirably increases HCI degradation in the device. The increase in HCI degradation resulting from the increased doping concentration of the LDD region often significantly undermines any beneficial reduction in on-resistance that may otherwise be achieved by increasing the doping concentration of the LDD region. Furthermore, by increasing the doping concentration of the LDD region in the device, a breakdown voltage of the device is undesirably reduced.

Accordingly, it is desirable to provide improved MOS devices capable of controlling HCI degradation that do not suffer from one or more of the problems exhibited by conventional MOS devices. Moreover, it is desirable to provide such improved MOS devices that are compatible with existing integrated circuit (IC) fabrication process technologies. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits with improved LDMOS structures are provided. In accordance with one embodiment, an integrated circuit includes a semiconductor substrate, a plurality of shallow trench isolation (STI) regions, each extending at least a first depth below an upper surface of the semiconductor substrate. The STI regions electrically isolate devices fabricated in the semiconductor substrate. The integrated circuit further includes a transistor structure. The transistor structure includes a gate dielectric positioned over a portion of a first one of the plurality of STI regions, a drain region adjacent to the first one of the plurality of STI regions and spaced apart from the gate dielectric, a first gate electrode that extends over a first portion of the gate dielectric, a second gate electrode that extends over a second portion of the gate dielectric and positioned adjacent to the first gate electrode, and a source region positioned adjacent to the first portion of the gate dielectric.

In another exemplary embodiment, a method of operating the above-described integrated circuit includes applying a first voltage at the first gate electrode and applying a second voltage at the second gate electrode. The second voltage is greater than the first voltage.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Various embodiments of an LDMOS integrated circuit are described herein. The embodiments utilize a dual gate electrode to form the LDMOS structure, with a differential voltage applied between each gate electrode. The described embodiments reduce the impact of the HCI phenomenon, thereby allowing the LDMOS integrated circuits to be operated at more desirable voltage and current levels.

Figure 1:
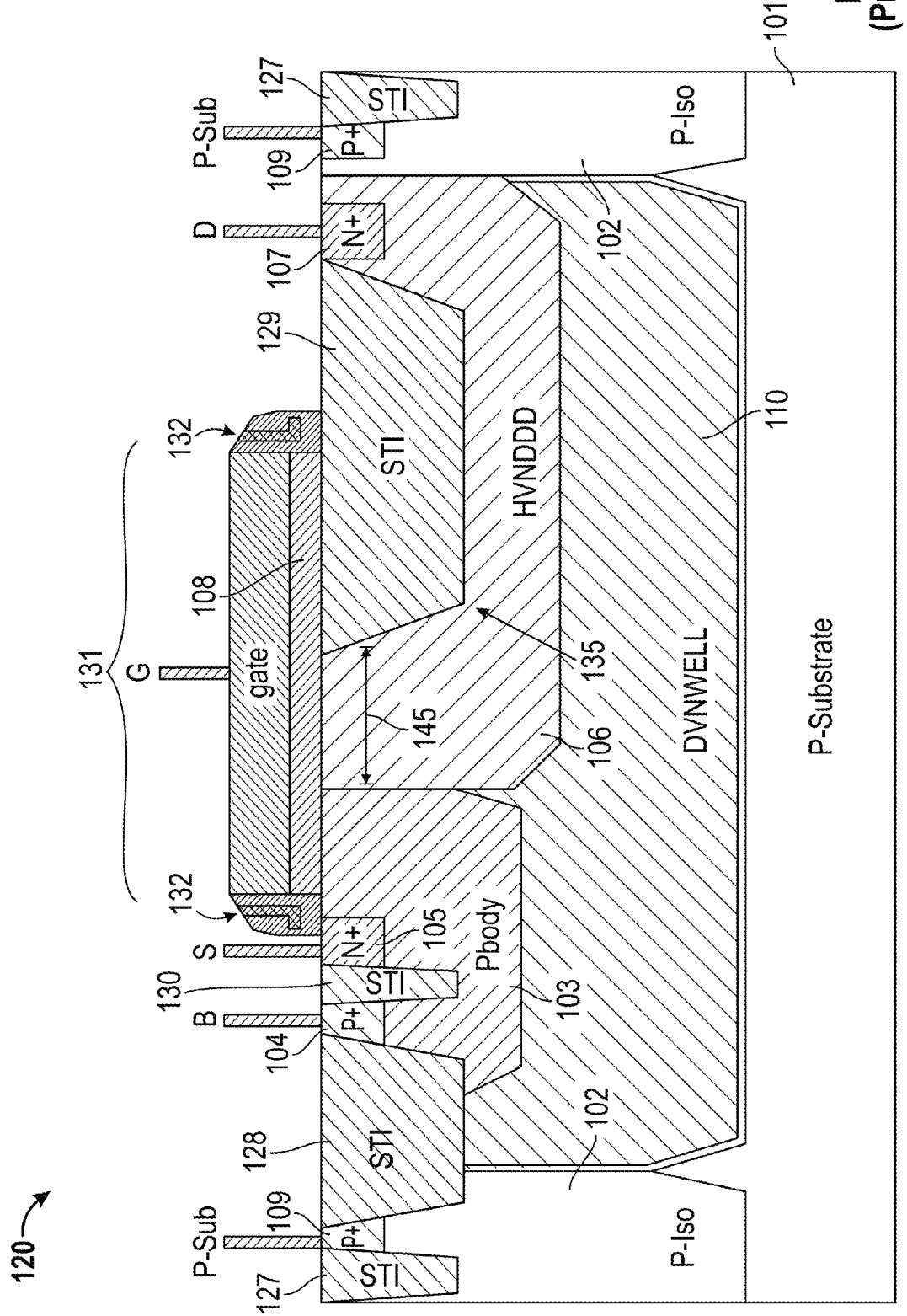
FIG. 1 is a cross-sectional views of a conventional LDMOS transistor of the prior art.

FIG. 1 is a cross sectional view of a conventional LDMOS transistor 120, provided for purposes of comparison with the present invention, which includes P− substrate 101, primary n-well regions 110, deep p-well region 103, P+ backgate contact 104, N+ source region 105, n-type reduced surface field region 106, N+ drain contact region 107, gate oxide layer 108, shallow trench isolation (STI) regions 128, 129 and 130, and gate electrode 131. The gate electrode 131 includes disposed along the sides thereof sidewall spacer structures 132. The LDMOS transistor 120 is electrically separated from other features that may be formed in an integrated circuit by p-type isolation regions 102 and shallow trench isolation regions 127. The p-type isolation regions are provided with P+ contacts 109 thereto.

STI regions 129 and 130 are formed simultaneously by conventional methods (i.e., etching trenches in the substrate, and then filling the trenches with dielectric material). STI regions 129 and 130 provide electrical isolation between LDMOS transistor 120 and other devices (not shown) that may be fabricated in the same substrate. STI region 130 usually has a depth of about 3500 Angstroms. Because they are fabricated at the same time, STI regions 129 and 130 have the same depth (e.g., 3500 Angstroms). The large depth of STI region 129 causes LDMOS transistor 120 to exhibit a high on-resistance. In addition, the sharp corners 135 typical of STI region 129 locally increases the electric field at those corners, which results in rapid hot carrier degradation and lower breakdown voltage within LDMOS transistor 120.

Figure 2:
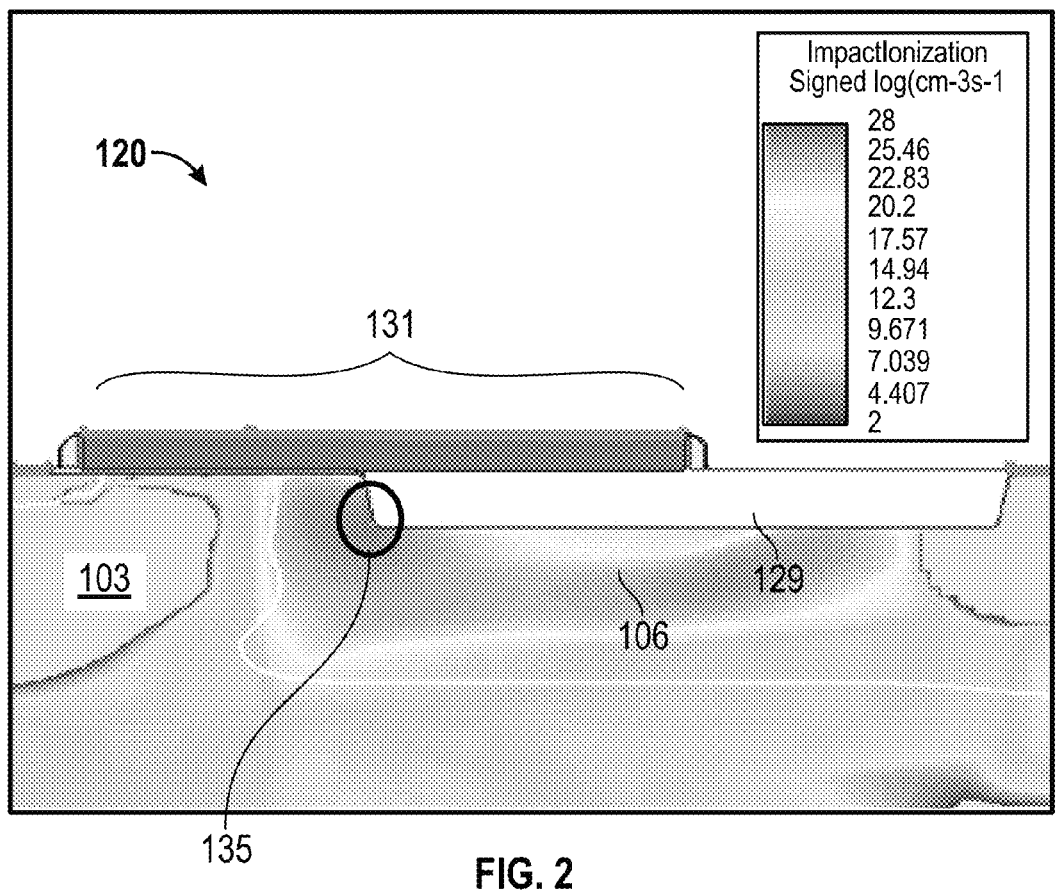
FIG. 2 is an illustration of the electric field generated during the operation of the conventional LDMOS transistor shown in FIG. 1.
Figure 3:
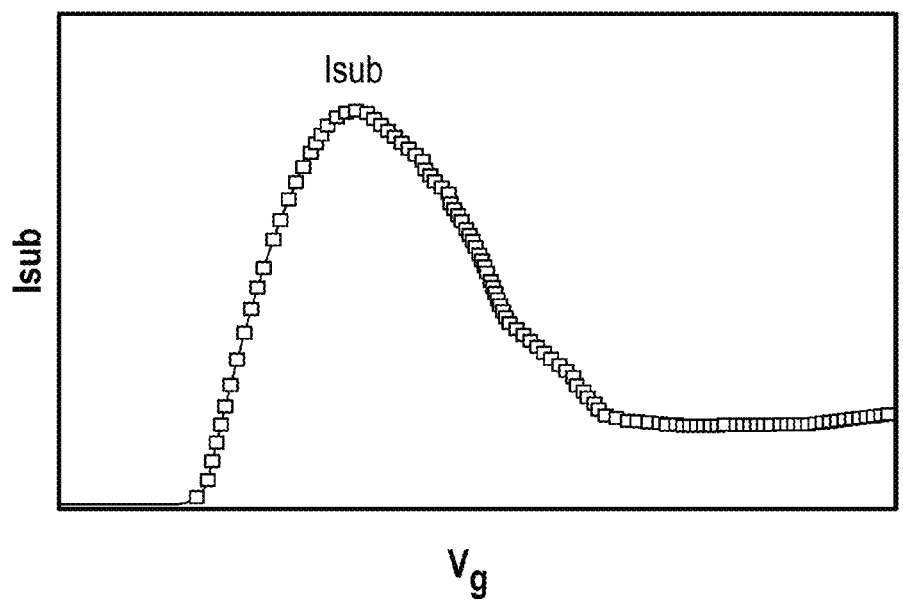
FIG. 3 is a graph illustrating the current and voltage curve of the conventional LDMOS transistor shown in FIG. 1.

In high voltage and power applications, it is desirable to minimize the on-resistance of LDMOS transistor 120, such that the switch area and power dissipation associated with this transistor 120 is minimized. However, current flowing through LDMOS transistor 120 is forced to bypass the STI region 129, thereby resulting in a relatively high on-resistance. That is, the current flowing through LDMOS transistor 120 must flow deep within the silicon, along the relatively long path that exists under STI region 129. FIG. 2 is illustrative of this current flow. As shown therein, a locally strong electric field exists at the sharp corner region 135 of STI region 129. Further, the electric field is relatively strong underneath the STI 129 due to the deep flowing current in n-type region 106. This strong electric field, as noted above, causes the HCI phenomenon. The HCI phenomenon, in turn, causes the reduced device performance, as indicated in FIG. 3, which plots the substrate current (Isub) versus gate voltage (Vg). That is, increasing gate voltage beyond a certain level, depending on design parameters, causes reduced substrate current flow, due to increasing resistance.

Figure 4A:
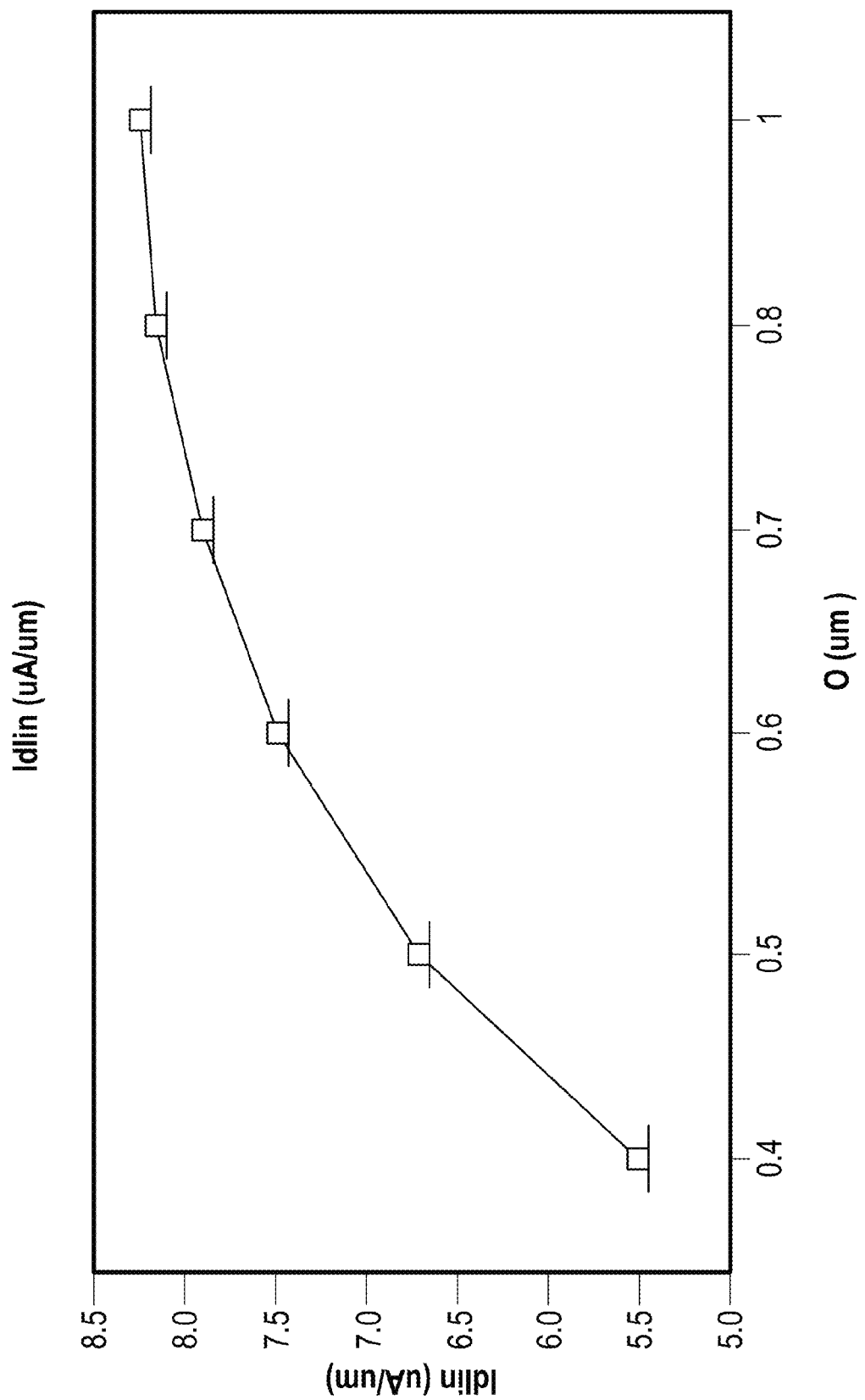
FIGS. 4A-4C are graphs illustrating the current, current, and voltage impact of the variations in the configuration of an LDMOS transistor.
Figure 4B:
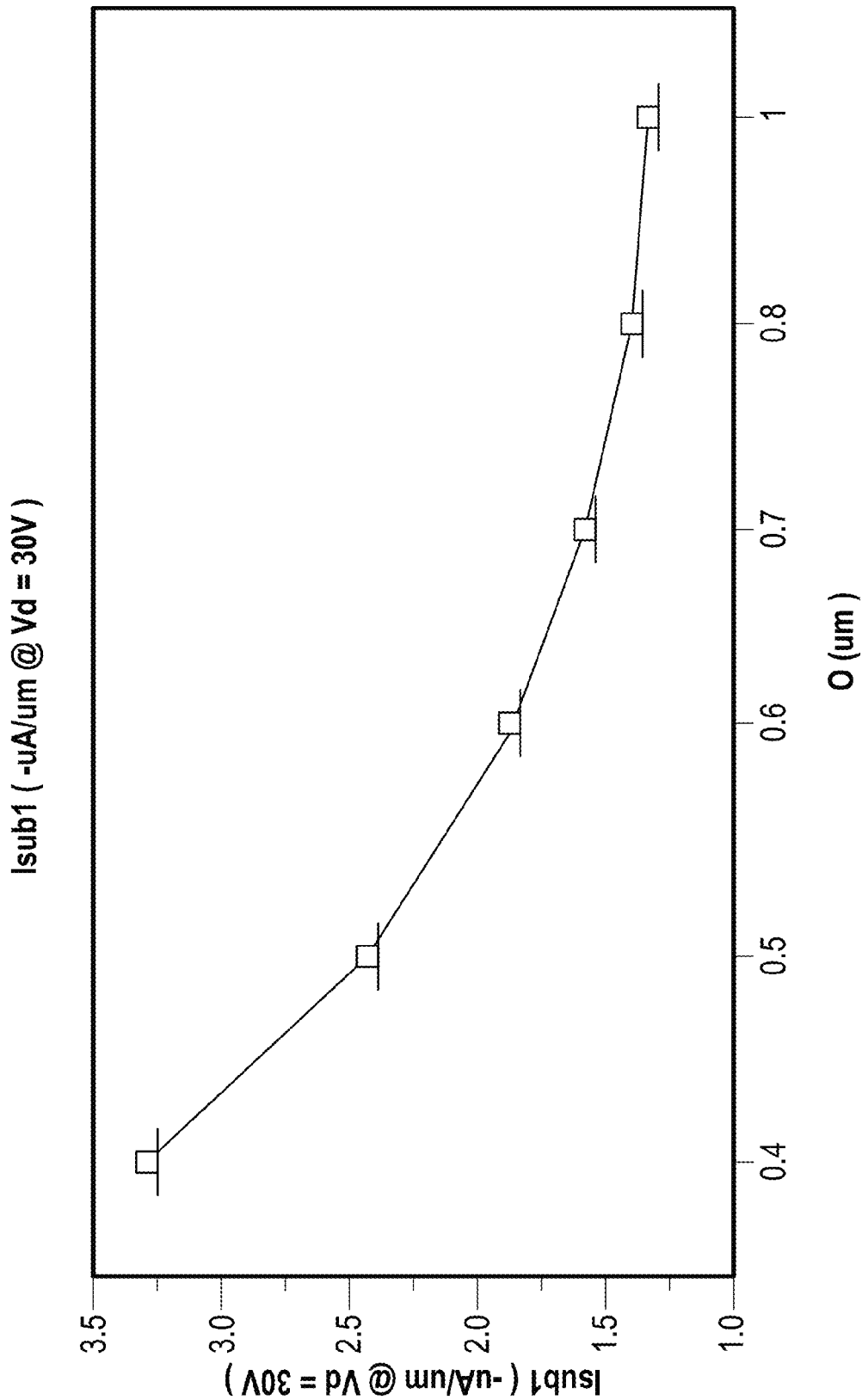
Figure 4C:
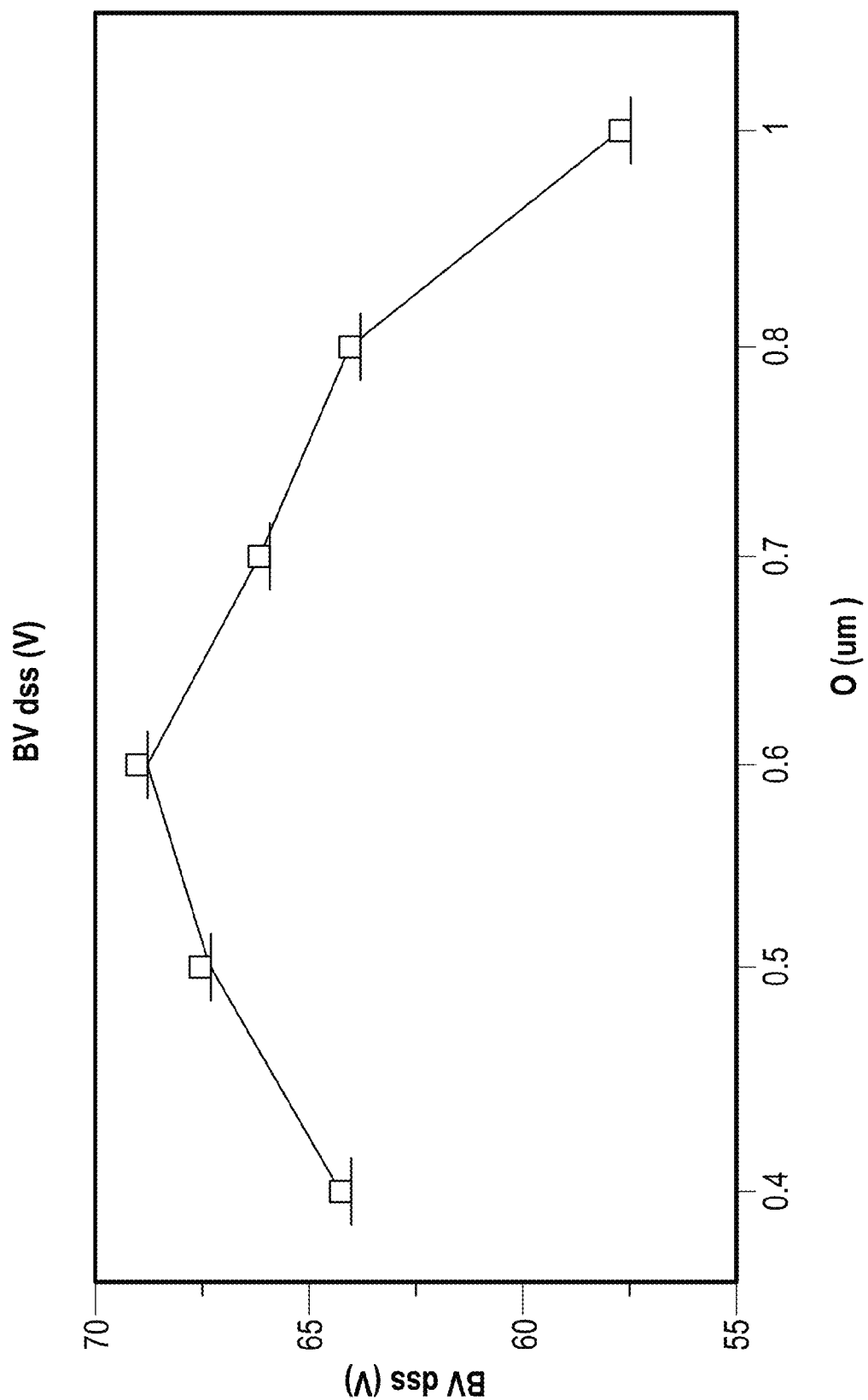

As further shown in FIG. 1, a distance 145 is defined between the p-well region 103 and the STI region 129, directly below the gate dielectric 108. Computational experimentation with the magnitude of distance 145 has shown that larger distances 145 achieve better current performance, as illustrated in FIGS. 4A and 4B; FIG. 4A compares the linear drain current (Idlin) to the distance 145, which is referred to as distance "O" in the Figures, and FIG. 4B compares the substrate current (Isub) at a drain voltage of 30 volts to the distance "O" (i.e., distance 145). However, increasing the distance 145 undesirably results in decreasing drain to source voltage (BVdss), as illustrated in FIG. 4C. Thus, it would be desirable to provide a configuration that allows for an increasing distance 145 for better current performance, but that does not result in a loss of source/drain voltage.

Figure 5:
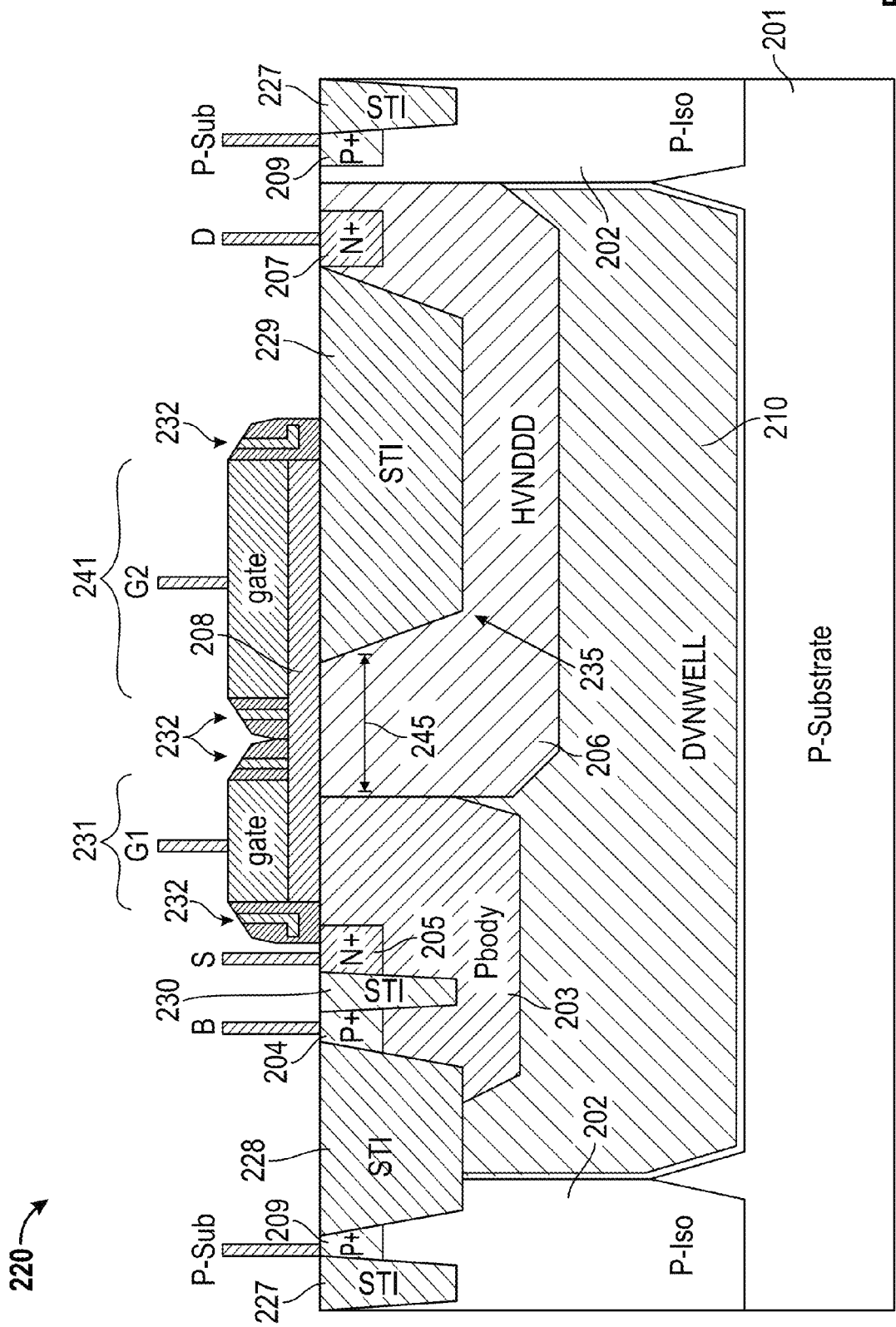
FIG. 5 is a cross-sectional view of an LDMOS transistor in accordance with one embodiment of the present disclosure and FIGS. 6A-6F are illustrations of the electric field generated during the operation of both the conventional LDMOS transistor shown in FIG. 1 and the LDMOS transistor of the present disclosure shown in FIG. 5.

Accordingly, an illustrative embodiment of the present disclosure is provided in connection with FIG. 5. FIG. 5 is a cross sectional view of a transistor 220 in accordance with various embodiments, which includes P− substrate 201, primary n-well regions 210, deep p-well region 203, P+ backgate contact 204, N+ source region 205, n-type reduced surface field region 206, N+ drain contact region 207, gate oxide layer 208, shallow trench isolation (STI) regions 228, 229 and 230, and two gate electrodes 231, 241 positioned adjacent to one another. Gate electrode 231 is positioned over the deep p-well region 203 and the n-type field region 206, whereas gate electrode 241 is positioned over the n-type field region 206 and the STI region 229. The gate electrodes 231, 241 include disposed along the sides thereof sidewall spacer structures 232. The LDMOS transistor 220 is electrically separated from other features that may be formed in an integrated circuit by p-type isolation regions 202 and shallow trench isolation regions 227. The p-type isolation regions are provided with P+ contacts 209 thereto.

The fabrication of LDMOS transistor 220 in accordance with one embodiment of the present disclosure will now be described. As illustrated in FIG. 5, LDMOS transistor 220 is fabricated in a p-type semiconductor region 201. P-type semiconductor region 201 can be, for example, a p-type monocrystalline silicon substrate. P-type semiconductor region 201 may alternately be an epitaxially grown p-type silicon layer or a p-type silicon-on-insulator (SOI) region. An N-type tub (primary well) region 210 is formed in p-type semiconductor region 201 by conventional CMOS processing steps, which include: forming an implant mask, implanting an n-type impurity through an opening in the mask, and thermally diffusing the n-type impurity. Wells 203 and 206 are formed thereabove in a similar fashion, with appropriate doping impurities.

As further shown in FIG. 5, a number of field isolation regions are then fabricated at the upper surface of the resulting semiconductor structure. In the illustrated example, field isolation regions 227 through 230 are shallow trench isolation (STI) regions, which are formed using conventional CMOS processing steps. In the described example, STI regions 227-230 have a depth of about 3500 Angstroms, although other depths are possible. In alternate embodiments, field isolation regions 227-230 can be formed by conventional LOCOS or poly-buffered LOCOS (PBLOCOS) processes.

In order to form the dielectric layer 208, a thermal oxide layer is formed over the semiconductor substrate. The thermal oxide dielectric layer 208 is formed using conventional thermal oxidation techniques, well-known in the art. The layer 208 is appropriately patterned by: forming a photoresist mask, performing a dry etch, and then removing the photoresist mask.

Thereafter, in order to form the gate electrodes 231, 241, a polysilicon layer is deposited over the substrate. A first gate line photoresist mask is formed over the polysilicon layer, and an etching procedure is performed through the openings of this gate line mask. This etch defines the gate electrodes 231 and 241. The gate line photoresist mask is then removed, and the remaining portion of the etched polysilicon layer forms the gate electrodes 231 and 241.

Source/drain extension implants are performed to create lightly doped source/drain extension regions in LDMOS transistor 220. Dielectric sidewall spacers 232 are then formed adjacent to the gate electrodes 231 and 241. An N+ implant is performed to create source/drain contact regions 205, 207. Metal salicide regions are formed over the resulting structure using a conventional salicide process. A standard CMOS process is used to form the remaining backend structures (e.g., contacts, metals and vias), which are not shown for the sake of clarity.

Thus, it will be appreciated that the primary difference between the presently described process flow and those previously known in the art is the patterning of two gate electrodes as opposed to one. This patterning change can be implemented by a simple redesign of the appropriate patterning mask(s). Thus, the described process flow is easily integrated into existing CMOS process flows without the need for significant modifications.

As noted above, gate electrode 231 is positioned over the deep p-well region 203 and the n-type field region 206, and gate electrode 241 is positioned over the n-type field region 206 and the STI region 229. A distance 245 is defined between the p-well region 203 and the STI region 229, directly below the gate dielectric 208. Distance 245 thus spans beneath both gate electrodes 231 and 241. In operation, a relatively high voltage is applied at gate electrode 241, for example about 5.0-7.0 volts, such as about 5.5 to about 6.5 volts, whereas a typical gate voltage, for example about 2.0-4.0 volts, such as about 2.5-3.5 volts, or less, is applied at gate electrode 231. This dual gate electrode configuration, with differential voltages applied, allows for the source/drain voltage to maintained at typical operational levels without corresponding losses in current performance, as indicated in FIGS. 4A through 4C, when the distance 245 is increased to accommodate better current performance. For example, in one embodiment, the distance 245 is about 0.6 to about 1.2 μm, such as about 0.7 to about 1.1 μm, for example about 0.8 to about 1.0 μm, i.e., about 0.2 to about 0.4 μm larger than in prior designs (distance 145).

Table 1 provides an example of a computational simulation using the LDMOS design shown in FIG. 5. As shown in Table 1, the linear current, the on-resistance (Rdson), and the drain to source voltage are maintained at comparable levels to the prior art LDMOS transistors. However, the substrate current is substantially improved.

TABLE 1

| | Simulation Result Parameters | | | |
|---|---|---|---|---|
| | Isub | Idlin | Rdson | BVdss |
| | | | Unit | |
| | uA/um | uA/um | mohm * mm2 | V |
| FIG. 1 | 13.96 | 7.71 | 73.3 | 75.49 |
| FIG. 5 | 7.86 | 7.98 | 74.5 | 75.80 |

Figure 6A:
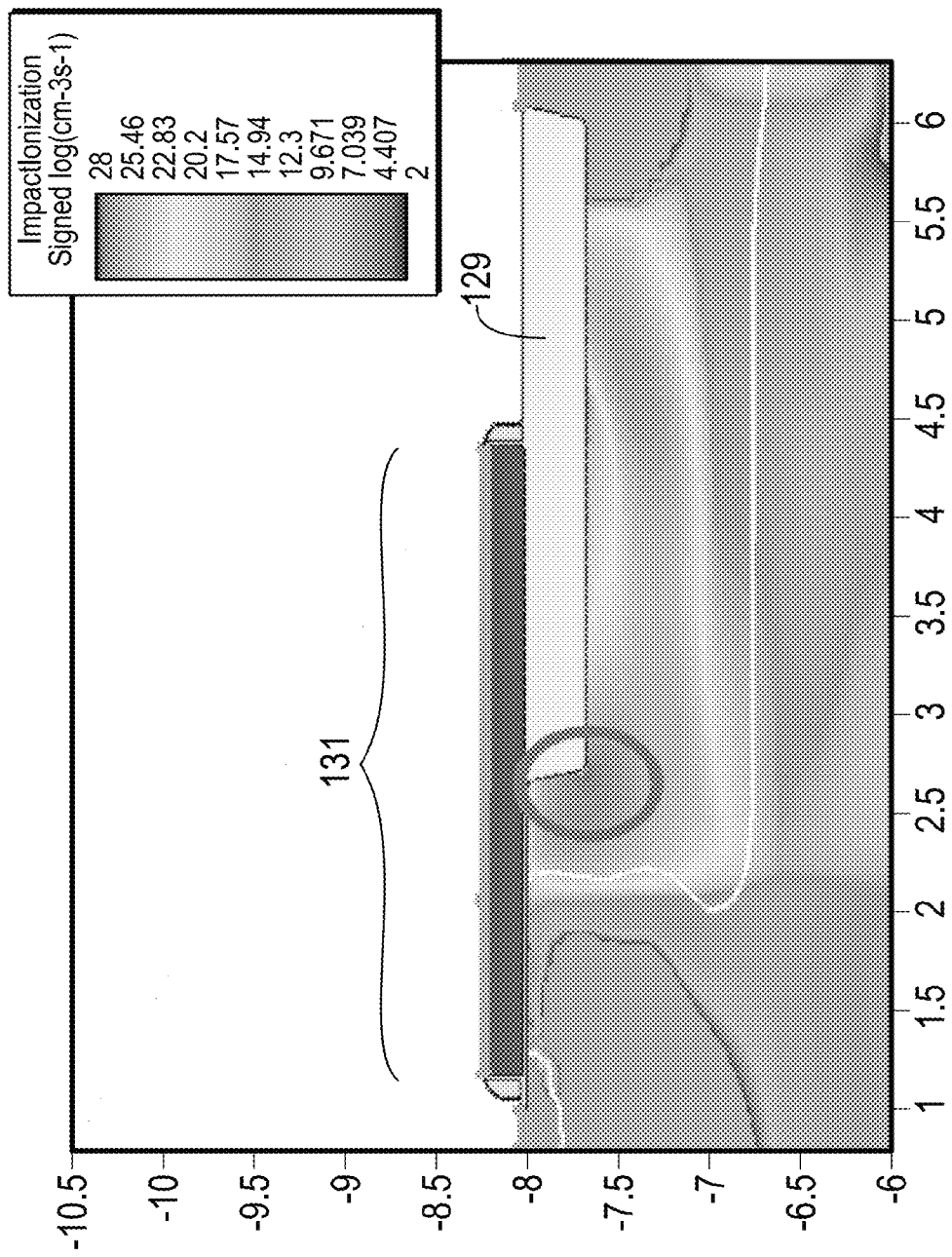
Figure 6B:
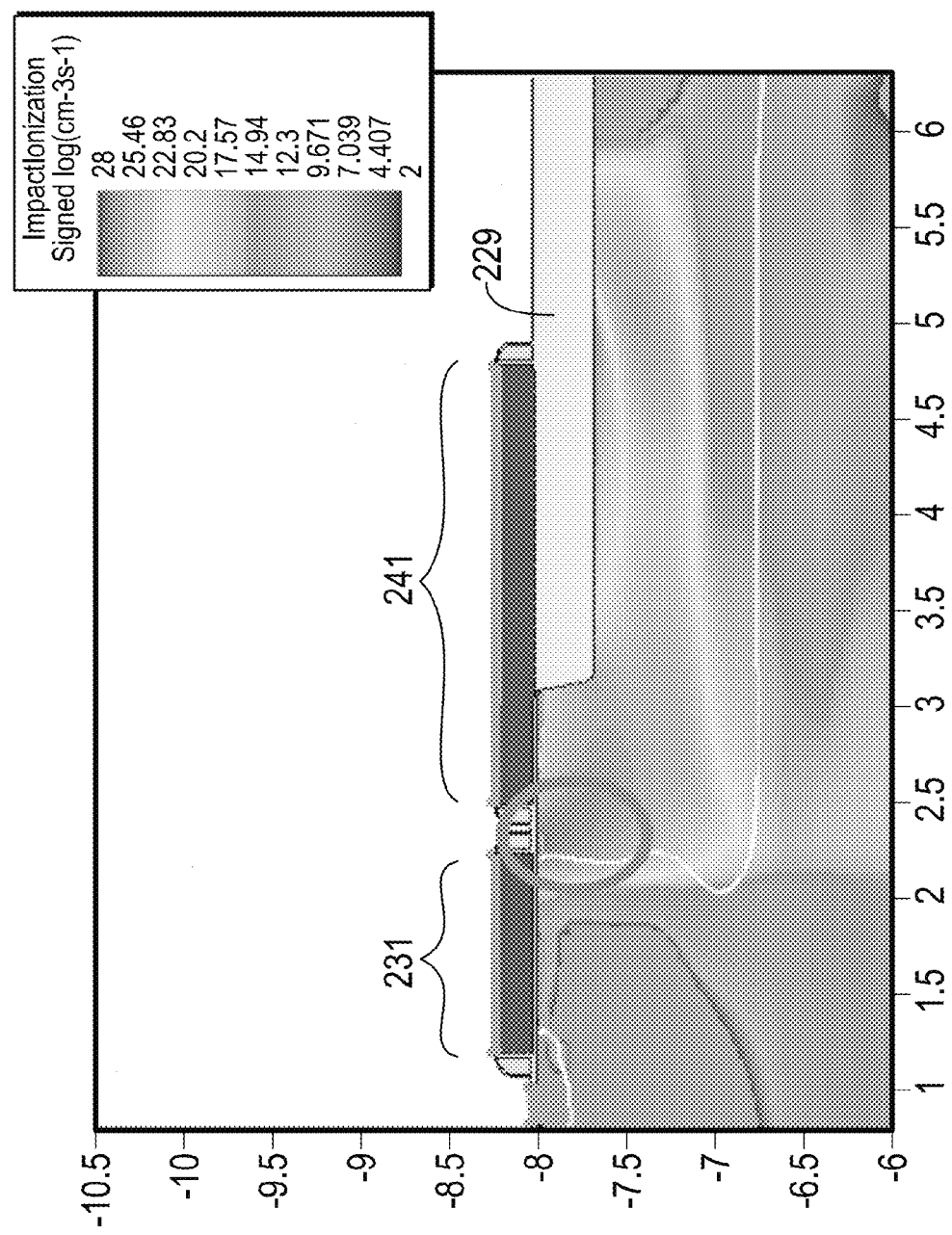
Figure 6C:
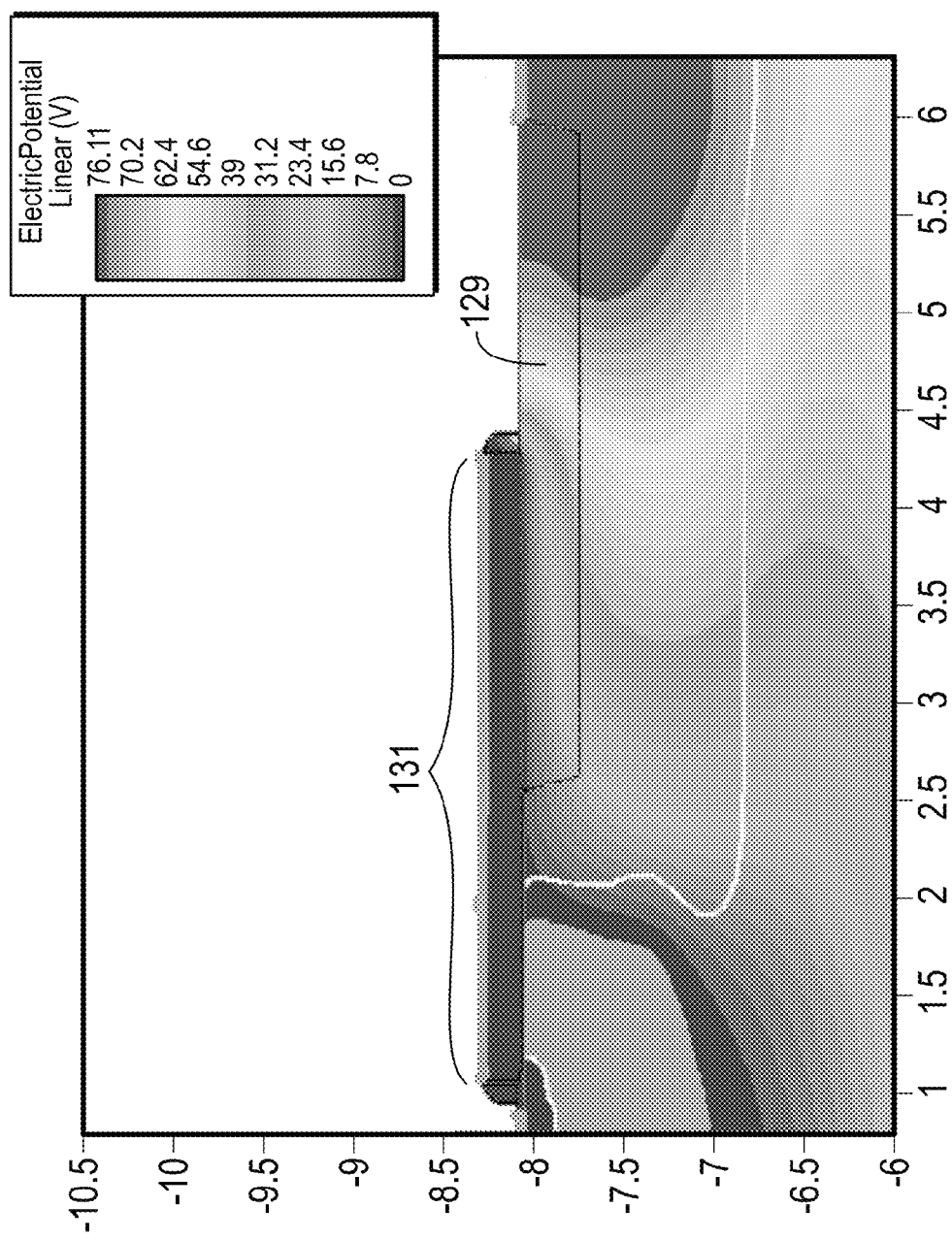
Figure 6D:
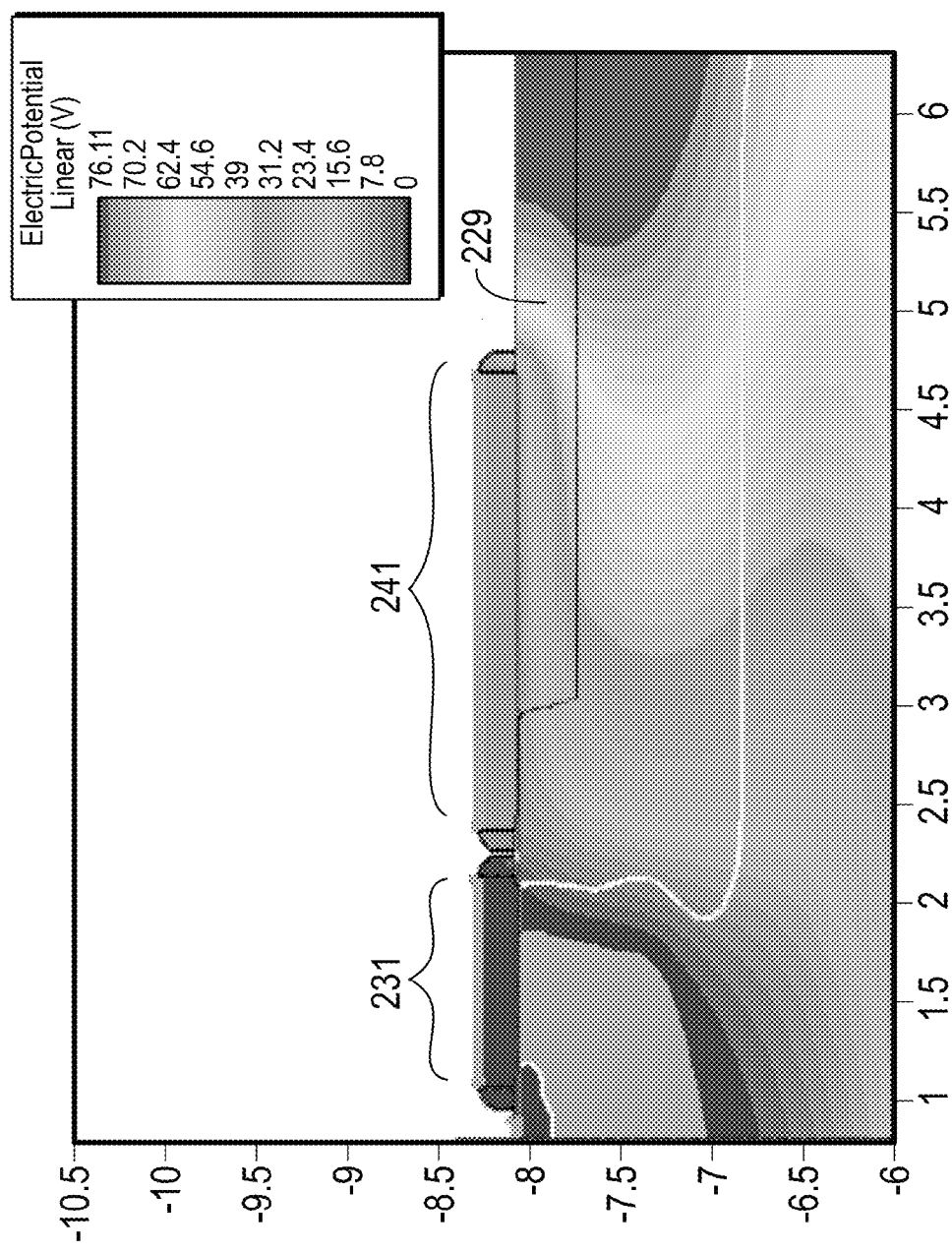
Figure 6E:
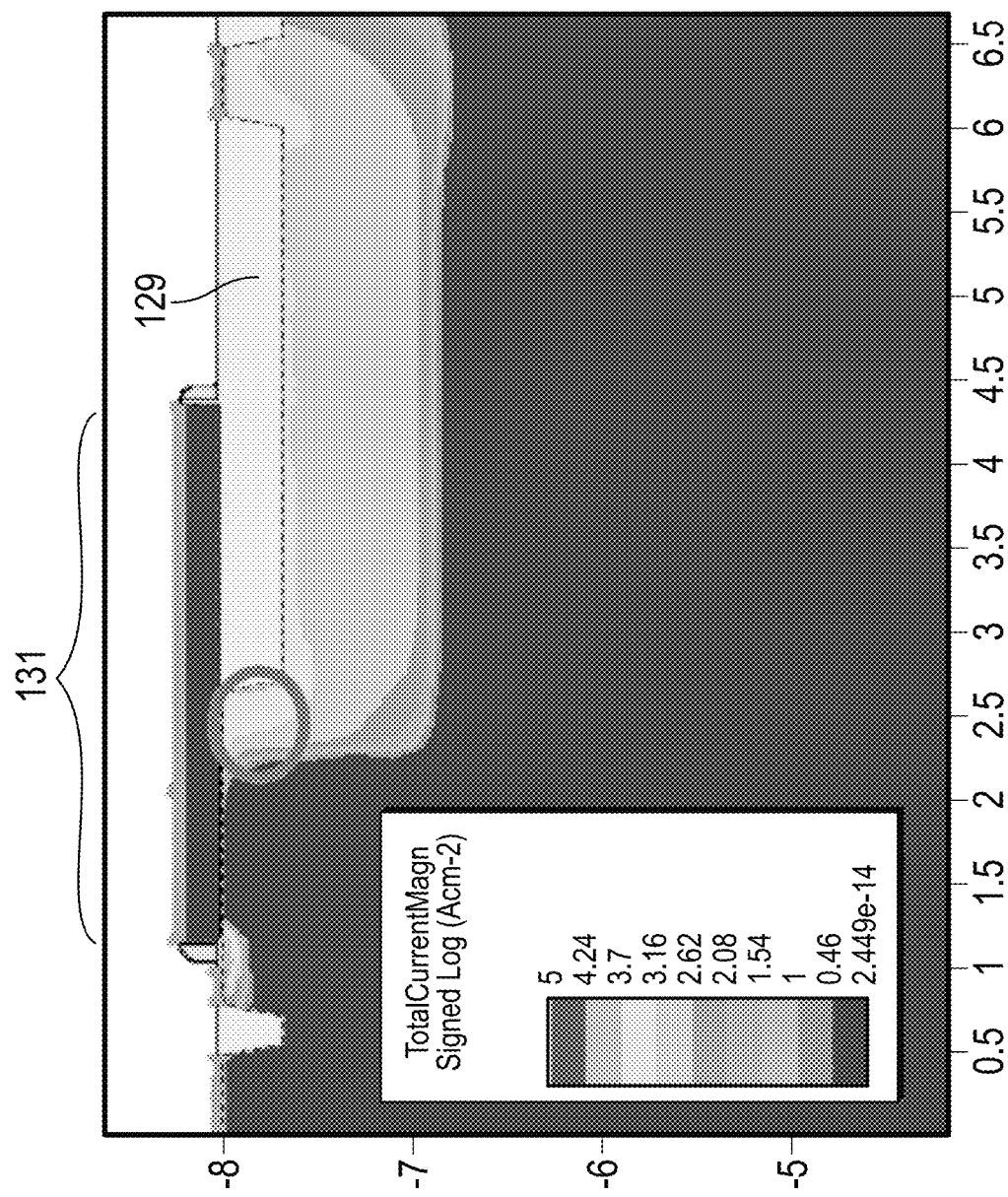
Figure 6F:
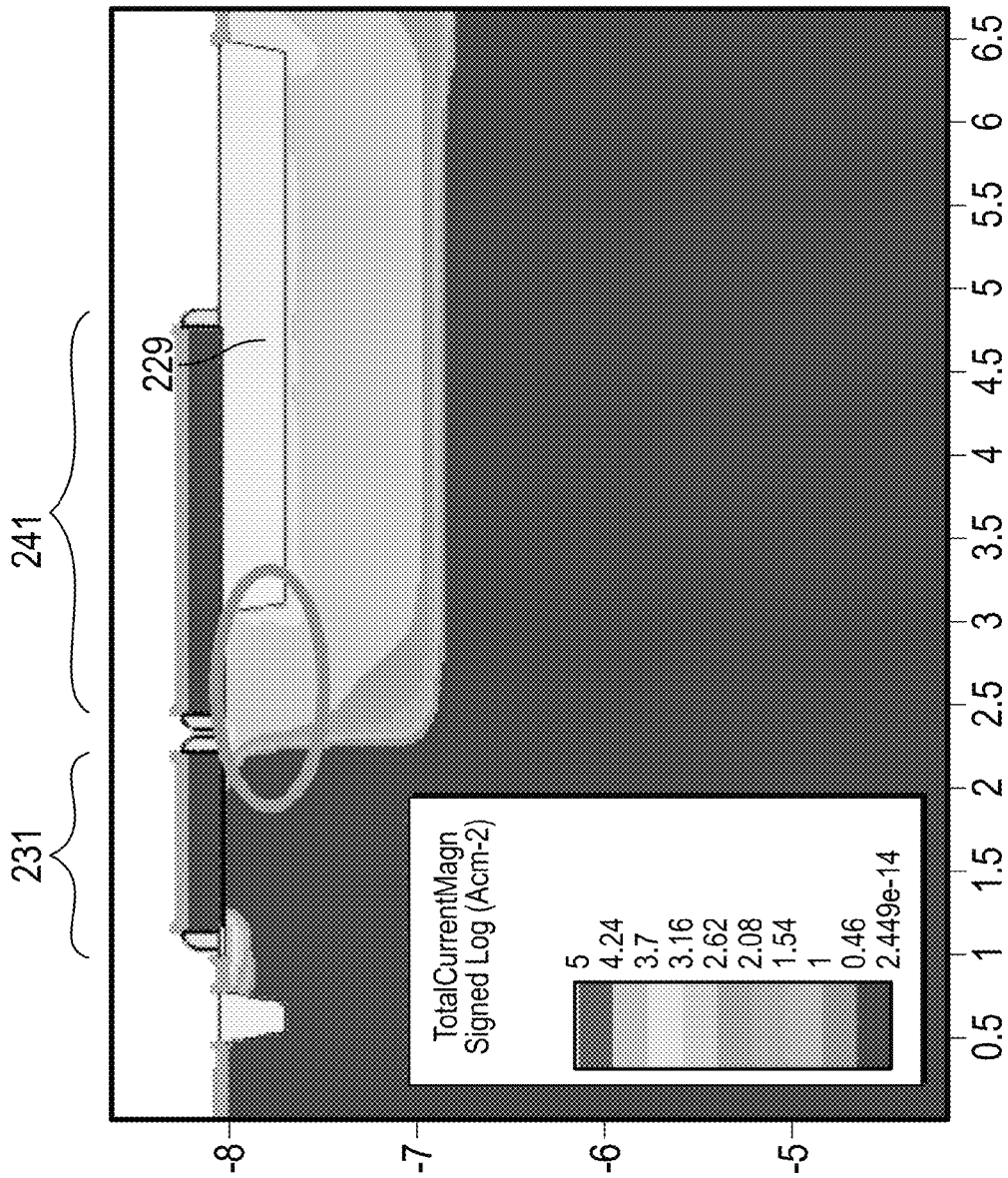

FIGS. 6A through 6F further illustrate these benefits, wherein FIGS. 6A, 6C, and 6E represent simulations of the electric field, the drain to source voltage, and the linear current, respectively, of the prior art configuration, and wherein FIGS. 6B, 6D, and 6F represent simulations of the electric field, the drain to source voltage, and the linear current, respectively, of a configuration in accordance with the present disclosure. With particular attention to FIGS. 6A and 6B, the electric field is significantly reduced at the corner region of the STI 229 due to the dual gate electrode configuration. In FIGS. 6C and 6D, the voltage profile is comparable between the configurations. Further, comparing FIGS. 6E and 6F, it is clear that the current flowpath is widened in FIG. 6F, thus allowing for an improved linear current.

As such, described herein are improved LDMOS devices capable of controlling HCI degradation so as to improve current and voltage performance during operation of the devices. Further, the described LDMOS devices are compatible with existing integrated circuit (IC) fabrication process technologies.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An integrated circuit comprising:
   a semiconductor substrate;
   a plurality of shallow trench isolation (STI) regions, each extending at least a first depth below an upper surface of the semiconductor substrate, wherein the STI regions electrically isolate devices fabricated in the semiconductor substrate; and
   a transistor structure comprising:
      a gate dielectric positioned over a portion of a first one of the plurality of STI regions;
      a drain region adjacent to the first one of the plurality of STI regions and spaced apart from the gate dielectric;
      a first gate electrode that extends over a first portion of the gate dielectric, the first gate electrode having sidewall spacer structures formed at opposite lateral ends thereof;
      a second gate electrode that extends over a second portion of the gate dielectric, the second gate electrode having sidewall spacer structures formed at opposite lateral ends thereof, and wherein the first gate electrode is separated from the second gate electrode by the spacer structures of the first gate electrode and the spacer structures of the second gate electrode, and wherein the spacer structures of the second gate electrode are positioned adjacent to the spacer structures of the first gate electrode, and wherein an entirety of an upper surface of the first gate electrode is co-planar with an entirety of an upper surface of the second gate electrode, and wherein the second gate electrode is positioned over the first one of the plurality of STI regions; and
   a source region positioned adjacent to the first portion of the gate dielectric.

2. The integrated circuit of claim 1, wherein the drain region is disposed within an n-type well of the semiconductor substrate.

3. The integrated circuit of claim 2, wherein the source region is disposed within a p-type well of the semiconductor substrate.

4. The integrated circuit of claim 3, wherein the n-type well and the p-type well are adjacent to one another.

5. The integrated circuit of claim 3, wherein the first gate electrode is positioned over the p-type well.

6. The integrated circuit of claim 5, wherein the first gate electrode is further positioned over the n-type well.

7. The integrated circuit of claim 6, wherein the second gate electrode is further positioned over the n-type well.

8. The integrated circuit of claim 3, wherein the first one of the plurality of STI regions is positioned within the n-type well.

9. The integrated circuit of claim 8, wherein a distance O separates the first one of the plurality of STI regions from the p-type well, and wherein the distance O is about 0.6 microns to about 1.2 microns in width.

10. The integrated circuit of claim 9, wherein the distance O is about 0.7 to about 1.1 microns in width.

11. The integrated circuit of claim 3, wherein both the n-type well and the p-type well are disposed within a deep n-well.

12. The integrated circuit of claim 1, wherein at least one side sidewall spacer structure of each of the first and second gate electrodes is positioned above the gate dielectric and wherein at least one other sidewall spacer structure of each of the first and second gate electrodes is positioned adjacent to, but not above, the gate dielectric.

13. A method of operating an integrated circuit comprising:
providing an integrated circuit in accordance with claim 1;
applying a first voltage at the first gate electrode;
applying a second voltage at the second gate electrode, wherein the second voltage is greater than the first voltage.

14. The method of claim 13, wherein applying the first voltage comprises applying a voltage that is about 2.0 volts to about 4.0 volts.

15. The method of claim 14, wherein applying the second voltage comprises applying a voltage from about 5.0 volts to about 7.0 volts.

16. An integrated circuit comprising:
a semiconductor substrate;
a plurality of shallow trench isolation (STI) regions, each extending at least a first depth below an upper surface of the semiconductor substrate, wherein the STI regions electrically isolate devices fabricated in the semiconductor substrate; and
a transistor structure comprising:
a gate dielectric positioned over a portion of a first one of the plurality of STI regions;
a drain region adjacent to the first one of the plurality of STI regions and spaced apart from the gate dielectric;
a first gate electrode that extends over a first portion of the gate dielectric, the first gate electrode having sidewall spacer structures formed at opposite lateral ends thereof;
a second gate electrode that extends over a second portion of the gate dielectric, the second gate electrode having sidewall spacer structures formed at opposite lateral ends thereof, and wherein the first gate electrode is separated from the second gate electrode by the spacer structures of the first gate electrode and the spacer structures of the second gate electrode, and wherein the spacer structures of the second gate electrode are positioned adjacent to the spacer structures of the first gate electrode, and wherein an entirety of an upper surface of the first gate electrode is co-planar with an entirety of an upper surface of the second gate electrode; and
a source region positioned adjacent to the first portion of the gate dielectric,
wherein a region defined by a distance O extends beneath the gate dielectric between the first one of the plurality of STI regions and a p-type well, and wherein at least a first portion of the first gate electrode extends over the region, and wherein at least a first portion of the second gate electrode extends over the region.

17. An integrated circuit comprising:
a semiconductor substrate;
a plurality of shallow trench isolation (STI) regions, each extending at least a first depth below an upper surface of the semiconductor substrate, wherein the STI regions electrically isolate devices fabricated in the semiconductor substrate; and
a transistor structure comprising:
a first gate electrode that extends over a first portion of the gate dielectric, the first gate electrode having sidewall spacer structures formed at opposite lateral ends thereof, and wherein the first gate electrode does not extend over any STI region; and
a second gate electrode that extends over a second portion of the gate dielectric, the second gate electrode having sidewall spacer structures formed at opposite lateral ends thereof, and wherein the first gate electrode is separated from the second gate electrode by the spacer structures of the first gate electrode and the spacer structures of the second gate electrode, and wherein the spacer structures of the second gate electrode are positioned adjacent to the spacer structures of the first gate electrode, wherein an entirety of an upper surface of the first gate electrode is co-planar with an entirety of an upper surface of the second gate electrode, and wherein a first portion of the second gate electrode does not extend over any STI region but a second portion of the second gate electrode extends over one STI region of the plurality of STI regions.

* * * * *